(12) United States Patent
Ewing et al.

(10) Patent No.: US 6,859,043 B2
(45) Date of Patent: Feb. 22, 2005

(54) ERGONOMIC MULTI-UNIT TEST FIXTURE

(75) Inventors: Phillip H. Ewing, Madison, AL (US);
Marc L. Roth, Huntsville, AL (US);
Paul L. Wooten, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 94 days.

(21) Appl. No.: 10/368,800

(22) Filed: Feb. 19, 2003

(65) Prior Publication Data

US 2004/0160226 A1 Aug. 19, 2004

(51) Int. Cl.⁷ .......................... H01H 31/04; G01R 31/02
(52) U.S. Cl. ..................................... 324/538; 324/158.1
(58) Field of Search ................................. 324/439, 755, 324/537–538, 158

(56) References Cited

U.S. PATENT DOCUMENTS 4,426,797 A * 1/1984 Burkemper et al. ......... 40/16.4
5,268,637 A * 12/1993 Liken et al. ............. 324/158 F
6,515,494 B1 * 2/2003 Low ........................... 324/752

* cited by examiner

Primary Examiner—N. Le
Assistant Examiner—Amy He
(74) Attorney, Agent, or Firm—Allen, Dyer, Doppelt Milbrath & Gilchrist, P.A.

(57) ABSTRACT

A test fixture interfaces plural units under test (UUTs) with test equipment within a common equipment rack. The test fixture supports a plurality of vertically spaced apart shelf units. A shelf unit has a support surface and an input/output connector panel adjacent thereto, that define a UUT insertion cavity. An input/output connector panel contains cable terminations that terminate cables to various testing equipments. Insertion of a UUT into the insertion cavity places communication ports of the UUT adjacent to cable terminations of the adjacent input/output connector panel. Jumper cables interconnect communication ports of the UUT with cable terminations of the adjacent input/output connector panel.

15 Claims, 3 Drawing Sheets

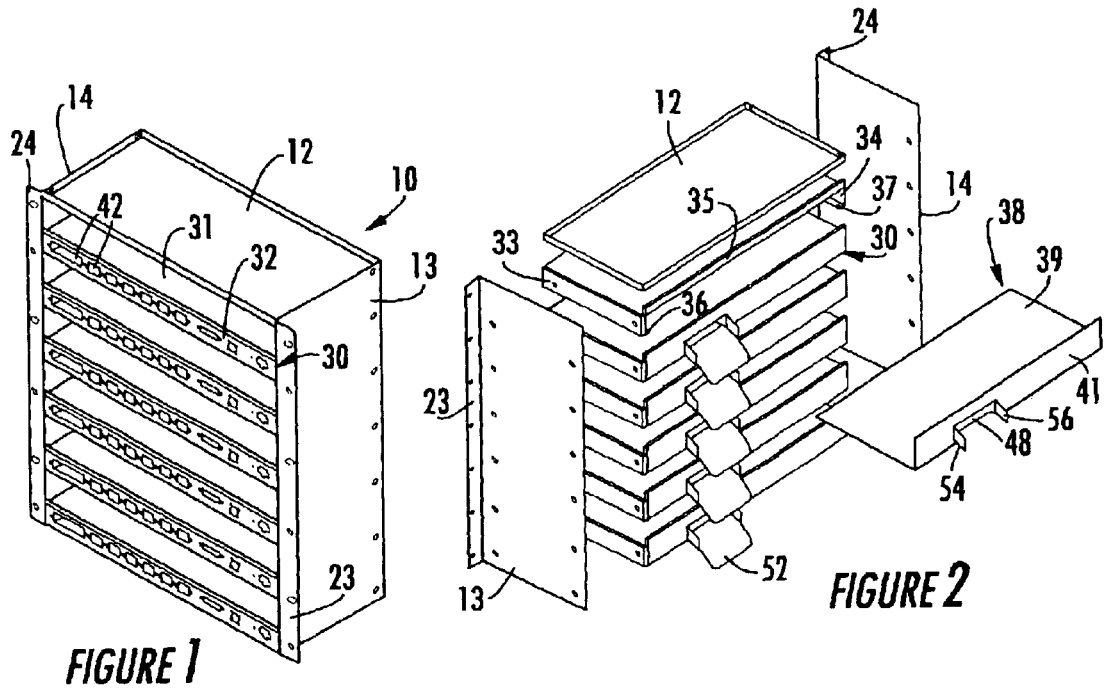
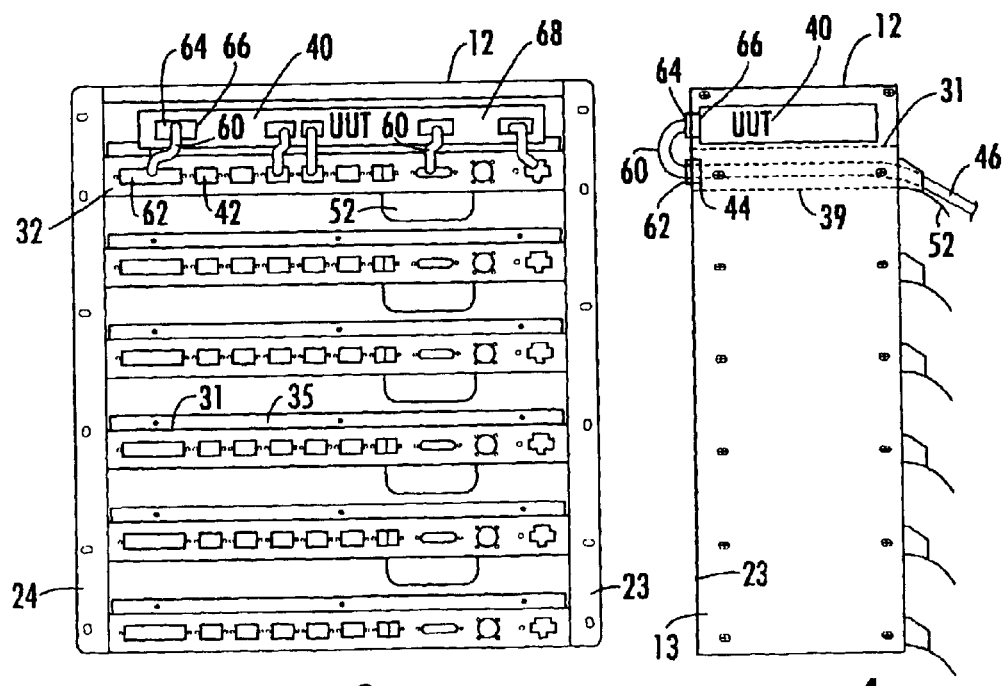

ERGONOMIC MULTI-UNIT TEST FIXTURE

FIELD OF THE INVENTION

The present invention relates in general to electronic test systems and subsystems, and is particularly directed to a new and improved multi-unit or test fixture configuration that facilitates ergonomic interconnectivity of a plurality of electronic modules or units, such as telecommunication modules, with a test apparatus therefor, in a space efficient and ease of access architecture.

BACKGROUND OF THE INVENTION

Traditional fixtures for testing a plurality of electronic circuit modules include 'card cage' structures, in which units (e.g., circuit boards) under test are 'plugged' into a backplane, and 'bed of nails' methods that connect probe points of the test fixture with the tested components. While such test fixtures may be satisfactory for relatively small components, they cannot be used for relatively large 'box-configured' devices, such as stand-alone communication modules containing one or more circuit boards housed within a common enclosure that is intended to be used as a tabletop or shelf-supported product.

Previous industry-accepted methods for performing test-connectivity for such box products include: placing the products side-by-side or stacked one on top of the other on a workbench, shelf, or conveyor; placing each product within its own fixtured carrier tray or pallet; and testing one box product at a time. Each of these approaches has inherent drawbacks. The first method requires an inordinate amount of floor space, and leaves the product vulnerable to cosmetic damage; the second scheme is expensive to fabricate and service, as each unit under test (UUT) requires its own fixtured pallet; the third approach increases the total test time (and therefore the total cost of test), since it cannot take advantage of testing multiple UUTs in parallel.

SUMMARY OF THE INVENTION

In accordance with the present invention shortcomings of conventional test connection arrangements, such as those referenced above, are effectively obviated by a multi-module test fixture configuration that facilitates reliable ergonomic connectivity with a test apparatus of a plurality of communication units, which may be of the same or different sizes, in a space efficient and ease of access architecture. As will be described, the multi-module test fixture of the invention requires only minimal physical effort on the part of test personnel to insert a unit under test and to make connections thereto.

To this end the multi-module test fixture of the invention comprises a multi-shelf unit that is installable in a standard electronic equipment rack that houses various test equipments to which a plurality of units under test (UUTs) are to be connected for testing. To facilitate insertion and connection of various units under test onto the shelves, the multi-shelf unit is preferably mounted in the rack at a height corresponding to the waist and eyes of a test equipment operator. A respective multi-shelf unit contains a plurality of vertically spaced apart shelves, a respective one of which has a generally 'flattened-U' shaped channel configuration including an upper, module-support plate, and an input/output connector plate. The top surface of the module-support plate is preferably coated with a low-friction material, to facilitate operator insertion and removal of a unit under test and to protect the UUT from cosmetic damage.

The input/output connector plate has a plurality of apertures that are configured to receive various types and shapes of cable connectors through which communication and power cables from test equipments housed in the equipment rack may be terminated. Cables extend from their associated connectors along a shelf floor plate and exit the rear of the test rack by way of a cable access port in the rear wall of the shelf. A cable drop flap and outwardly extending flanges are coupled with each cable access port and serve to gather together the cables going to internal equipment and provide strain relief to the cables.

A unit to be tested is inserted onto the top surface of a respective shelf such that the front of the UUT faces the rear of the equipment rack, and so that the rear of the UUT faces and is just above and adjacent to the input/output connector support plate of that shelf. This allows relatively short segments of jumper cable to be mated with associated connectors of the input/output connector support plate and input/output port connectors of the unit under test. The relatively short segments of jumper cable can be easily replaced as they wear out, making ongoing maintenance simple and inexpensive. This also provides flexibility for future UUT input/output connector changes, since different cables can be designed if the UUT connectors ever change. Once testing of a UUT has been completed, disconnecting only the jumper cable connectors from their associated connectors of the UUT allows the short segments of jumper cable to hang down, allowing unobstructed removal of the tested UUT from the shelf and insertion of a new UUT for testing. Once the new UUT has been inserted and connected the operator may then proceed to the UUT on the next lower shelf.

BRIEF DESCRIPTION OF THE DRAWINGS

FIG. 1 is a front perspective view of the multi-module test fixture of the present invention;

FIG. 2 is a rear exploded perspective view of the multi-module test fixture of FIG. 1;

FIG. 3 is a front view of the multi-module test fixture of FIG. 1 showing communication cable connectivity to a unit under test;

FIG. 4 is a side view of the multi-module test fixture shown in FIG. 3;

DETAILED DESCRIPTION

Figure 5:
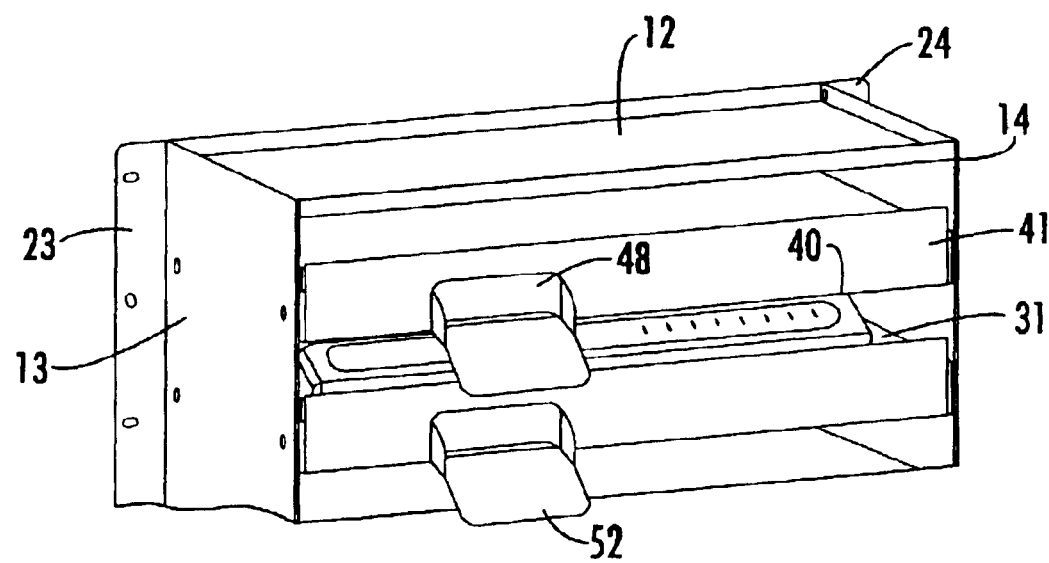
FIG. 5 is a partial rear perspective view of the multi-module test fixture of the invention supporting a unit under test.
Figure 6:
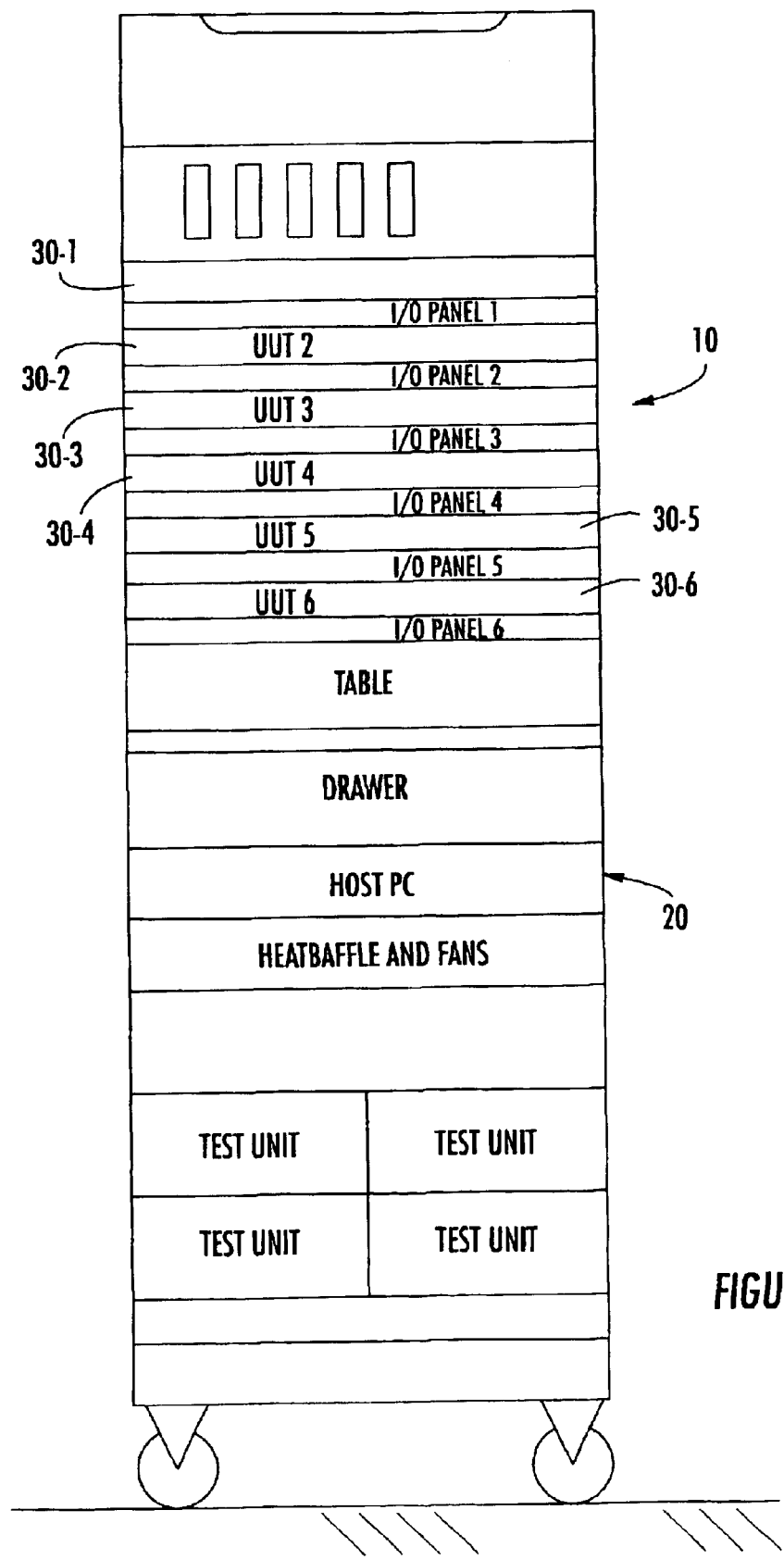
FIG. 6 shows an equipment rack containing the multi-module test fixture of the invention.

Attention is now directed to FIGS. 1–6, wherein the multi-module test fixture of the invention is diagrammatically shown as comprising a multi-shelf unit 10 that is configured to be installed within an industry standard floor-mounted equipment rack 20. The equipment rack 20 also houses various test equipments to which a plurality of electronic (e.g., telecommunication) units under test (UUTs) are to be connected for testing. As a non-limiting example, multi-shelf unit 10 is shown as containing six, vertically spaced apart shelves 30-1, . . . , 30-6, so as to form associated UUT test cavities therebetween. It is to be understood, however, that the invention is not limited to this or any particular number. To facilitate access by test personnel, the multi-shelf unit 10 is preferably mounted at a height corresponding to the vicinity of the waist and eyes of a test equipment operator, so as to facilitate the operator's insertion and connection of various communication modules or units under test onto the shelves. In order to avoid cluttering the drawings only a single UUT 40 is shown. FIGS. 3 and 4 and 5 show respective rear and side views of a UUT 40 installed on a topmost shelf 30-1, while FIG. 5 shows a perspective front view of a UUT inserted onto the next to top shelf 30-2 of multi-shelf unit 10.

As illustrated in the exploded rear perspective view of FIG. 2, the multi-shelf unit 10 includes a top panel 12, and a pair of side panels 13 and 14, to which the shelves 30 are attached in equally spaced apart vertical alignment by suitable fittings, such as screws and the like. The vertical separation of the UUT insertion cavities formed between successive shelves is such as to accommodate the height of UUTs to be placed upon the shelves for testing. The side panels are supported by vertical frame members 21 and 22 of the equipment rack by way of front flanges 23 and 24 respectively extending at right angles to side panels 13 and 14.

A respective shelf 30 has a generally inverted, 'flattened-U' shaped channel configuration defined by an upper, module-support plate 31, an input/output connector support plate 32, a pair of side walls 33 and 34 extending downwardly therefrom, and a vertically extending rear flange 35. The top surface of module-support plate 31 is preferably coated with low friction material, for ease of UUT insertion and withdrawal. This reduces operator effort when loading/unloading each shelf, and also protects the UUT from cosmetic damage.

Side walls 33 and 34 have respective flanges 36 and 37 that are sized to receive and retain a bottom member 38, formed of a bottom or floor plate 39 and a rear wall 41 extending vertically therefrom. The depth of the bottom member 38 corresponds to that of the upper plate 31 and the height of the rear wall 41 corresponds to the sum of the height of the side walls and rear flange of the shelf, so that with the floor plate 39 fully inserted onto the shelf bottom flanges 36 and 37, the rear wall 41 may be affixed to the rear flange 35 and thereby form a closure for the shelf.

The input/output connector support plate 32 is provided with a plurality of apertures 42 that are configured to receive various types and shapes of cable connectors 44 through which communication and power cables 46 from respective test equipments housed in the equipment rack may be terminated. Cables 46 extend from their associated connectors 44 along the shelf's floor plate 39 and exit the rear of the test rack 20 by way of a cable access port 48 formed in the rear wall 39 of the shelf. A cable drop flap 52 and a pair of outwardly bent flanges 54 and 56 are coupled with each cable access port 48, and serve to gather together the cables going to internal test equipment and provide strain relief to the cables.

As pointed out above, a unit under test 40 is placed upon the top surface 31 of a respective shelf 30, such that the front of the UUT faces the rear of the equipment rack (as shown in FIG. 5), and so that the rear of the UUT is just above and adjacent to the input/output connector support plate 32 of that shelf. As shown in the front view of FIG. 3 and the side view of FIG. 4, this serves a number of purposes. First, it allows the use of relatively short segments 60 of jumper cable, opposite ends of which contain connectors 62 and 64, that are readily physically aligned with and mate with associated connectors 44 of the input/output connector support plate 32 and input/output port connectors 66 at the rear wall 68 of the unit under test. The relatively short segments of jumper cable can be easily replaced as they wear out, which makes ongoing maintenance simple and inexpensive. This also provides flexibility for future UUT input/output connector changes, since different cables can be designed if the UUT connectors are changed.

Secondly, when the testing of a UUT 40 has been completed, disconnecting only the jumper cable connectors 64 from their associated connectors 66 of the UUT allows the short segments of jumper cable to hang down slightly, so that they are 'just out of the way' of the UUT, and provide unobstructed clearance for removal of the tested UUT from top surface of the shelf and insertion of a new UUT for testing. Once the new UUT has been inserted and connected, the operator may then proceed to the UUT on the next lower shelf and so on, with relative ease of replacement of each successive UUT.

While we have shown and described an embodiment in accordance with the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed is:

1. A method of interfacing a plurality of electronic units with a test apparatus that is operative to test one or more of said units when connected thereto, said method comprising the steps of:

(a) providing a housing having a first portion containing a plurality of vertically spaced apart, generally planar and horizontally extending shelves that are sized to receive respective ones of said plurality of electronic units that are insertable onto said shelves from a front side of said housing, said first portion of said housing being vertically spaced from a floor portion thereof and providing for ergonomic access by an individual installing said electronic units onto said shelves;

(b) vertically interleaving a plurality of generally horizontally extending input/output connector panels with said plurality of vertically spaced apart shelves therebetween, such that said plurality of generally horizontally extending input/output connector panels are parallel to said generally planar and horizontally extending spaced apart shelves and provide an alternating arrangement of generally horizontally extending input/output connector panels and generally planar, horizontally extending spaced apart shelves, such that a respective shelf is located between a pair of adjacent input/output connector panels, and such that a respective input/output connector panel is located between an adjacent pair of spaced apart shelves, so as to provide an opening that allows for the insertion of a respective electronic unit onto one of said spaced apart shelves, a respective input/output connector panel having a distribution of communication cable terminations at said front side of said housing that are configured to terminate communication cables providing communication connectivity to various testing equipments of said test apparatus installed in a second portion of said housing;

(c) inserting, from said front side of said housing, a respective generally horizontally extending electronic unit onto a respective one of said shelves such that communication ports of said respective electronic unit are adjacent to communication cable terminations of a respective input/output connector panel therebeneath at said front side of said housing; and (d) interconnecting said communication ports of said respective electronic unit and communication cable terminations of said respective input/output connector panel at said front side of said housing by relatively short lengths of jumper cable having first ends thereof connecting with said communication ports of said respective electronic unit and second ends thereof connecting with said communication cable terminations of said respective input/output connector panel.

2. The method according to claim 1, further comprising the steps of:

(e) disconnecting said first ends of said relatively short lengths of jumper cable from said communication ports of said respective electronic unit, so as to allow said relatively short lengths of jumper cable to drop down out of the way of said respective one of said shelves;

(f) removing said respective electronic unit from said respective one of said shelves;

(g) inserting a new electronic unit onto said respective one of said shelves such that communication ports of new respective electronic unit are adjacent to communication cable terminations of said respective input/output connector panel therebeneath; and (h) interconnecting said communication ports of said new electronic unit with said first ends of said relatively short lengths of jumper cable.

3. The method according to claim 1, wherein said electronic units comprise telecommunication units.

4. The method according to claim 1, wherein a respective shelf is defined by an upper, UUT-support plate, an input/output connector support plate, and a pair of side walls and extending downwardly therefrom, and further including a floor plate and a rear wall extending vertically therefrom, that form a closure for said shelf, and wherein said rear wall has a cable access port through which said communication cables pass for connection to said communication cable terminations of said respective input/output connector panel.

5. The method according to claim 4, wherein said UUT support plate is coated with low friction material.

6. The method according to claim 4, wherein a respective shelf includes a cable drop flap coupled with said cable access port.

7. The method according to claim 1, wherein said plurality of vertically spaced apart shelves are supported at a height corresponding to the vicinity of the waist and eyes of a test equipment operator.

8. A test fixture for interfacing plural units under test (UUTs) with test equipment within a common equipment rack comprising a plurality of vertically spaced apart shelf units, that are parallel to one another and are supported by said common equipment rack, a respective shelf unit having a generally planar, horizontally extending support surface for UUT and generally horizontally extending input/output connector panel adjacent thereto, that define a generally horizontal UUT insertion cavity facing a front side of said test fixture, and providing for the insertion of a UUT into said UUT insertion cavity and placement upon said generally horizontal support surface, and such that said plurality of vertically spaced apart shelf units provide an alternating arrangement of input/output connector panels and spaced-apart support surfaces, such that a respective support surface is located between an adjacent pair of input/output connector panels, and such that a respective input/output connector panel is located between a pair of spaced apart support surfaces, so as to provide said generally horizontal UUT insertion cavity, said input/output connector panel containing cable terminations at said front said of said test fixture that terminate cables to testing equipment supported within said common equipment rack, so that insertion of a UUT into said UUT insertion cavity places communication ports of said UUT adjacent to cable terminations of an adjacent input/output connector panel at said front side of said test fixture, and jumper cables which interconnect communication ports of the UUT with cable terminations of said adjacent input/output connector panel.

9. The test fixture according to claim 8, wherein a respective shelf unit comprises by an upper, UUT-support plate, an input/output connector support plate, and a pair of side walls and extending downwardly therefrom, and further including a floor plate and a rear wall extending vertically therefrom, that form a closure for said shelf unit, and wherein said rear wall has a cable access port through which said communication cables pass for connection to said communication cable terminations of said input/output connector panel.

10. A test fixture for interfacing a plurality of electronic units under test (UUTs) with test equipment that is operative to test said UUTs when connected thereto comprising a housing, and a plurality of generally horizontally extending shelf units supported by said housing in vertical spaced apart and parallel relationship, a respective shelf unit comprising a generally planar and horizontally extending UUT support surface and an input/output connector panel adjacent thereto at a front side of said test fixture, so as to define a UUT insertion cavity between said UUT support surface and another shelf unit, a respective input/output connector panel having a distribution of communication cable terminations at said front side of said test fixture that are configured to terminate communication cables that provide communication connectivity to various testing equipments of said test apparatus installed in said housing, and such that insertion of a respective electronic unit onto said support surface of said respective shelf unit causes communication ports of said respective electronic unit to be adjacent to communication cable terminations of said input/output connector panel adjacent thereto at said front side of said test fixture, and thereby provides for interconnection of said communication ports of said respective electronic unit and communication cable terminations of said respective input/output connector panel by jumper cables having first ends thereof connecting with said communication ports of said respective electronic unit and second ends thereof connecting with said communication cable terminations of said respective input/output connector panel at said front side of said test fixture.

11. The test fixture according to claim 10, wherein said respective shelf unit has a generally inverted flattened-U shaped channel configuration defined by an upper, UUT-support plate, an input/output connector support plate, and a pair of side walls and extending downwardly therefrom, and further including a floor plate and a rear wall extending vertically therefrom, that form a closure for said shelf unit, and wherein said rear wall has a cable access port through which said communication cables pass for connection to said communication cable terminations of said respective input/output connector panel.

12. The test fixture according to claim 11, wherein said UUT support plate is coated with low friction material.

13. The test fixture according to claim 11, wherein a respective shelf unit further includes a cable drop flap coupled with said cable access.

14. The test fixture according to claim 10, wherein said electronic units comprise telecommunication units.

15. The test fixture according to claim 10, wherein said plurality of shelf units are supported by said housing at a height corresponding to the vicinity of the waist and eyes of a test equipment operator.

* * * * *